United States Patent
Kodashima et al.

(10) Patent No.: US 7,883,579 B2
(45) Date of Patent: Feb. 8, 2011

(54) SUBSTRATE PROCESSING APPARATUS AND LID SUPPORTING APPARATUS FOR THE SUBSTRATE PROCESSING APPARATUS

(75) Inventors: Akira Kodashima, Nirasaki (JP); Shinichi Miyano, Nirasaki (JP); Takehiro Kato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 595 days.

(21) Appl. No.: 11/506,773

(22) Filed: Aug. 21, 2006

(65) Prior Publication Data

US 2007/0131167 A1    Jun. 14, 2007

Related U.S. Application Data

(60) Provisional application No. 60/775,788, filed on Feb. 23, 2006.

(30) Foreign Application Priority Data

Dec. 14, 2005    (JP)    .............................. 2005-360934

(51) Int. Cl.
  C23C 16/00    (2006.01)
  C23F 1/00    (2006.01)
  H01L 21/306    (2006.01)
(52) U.S. Cl. ................... 118/715; 118/728; 156/345.51
(58) Field of Classification Search ................... 29/240; 118/715, 719, 720, 723, 725, 733; 156/345.31, 156/345.32, 345.51, 345.52, 345.53, 345.54, 156/345.55; 204/298.35; 414/935, 940; 700/213, 214, 218, 228
See application file for complete search history.

(56) References Cited

U.S. PATENT DOCUMENTS

| | | | | |
|---|---|---|---|---|
| 4,412,812 A | * | 11/1983 | Sadowski et al. | ........... 432/121 |
| 6,183,184 B1 | * | 2/2001 | Shiwaku | ...................... 414/281 |
| 6,419,751 B1 | * | 7/2002 | Nagashima | .................. 118/715 |
| 6,558,506 B1 | * | 5/2003 | Freeman et al. | ........ 156/345.32 |
| 6,565,662 B2 | * | 5/2003 | Amano et al. | ................ 118/715 |
| 6,639,654 B2 | * | 10/2003 | Binnard et al. | ................. 355/72 |
| 6,719,851 B1 | | 4/2004 | Kurita et al. | |
| 2001/0006094 A1 | | 7/2001 | Amano et al. | |
| 2004/0108068 A1 | | 6/2004 | Senzaki et al. | |
| 2005/0000442 A1 | | 1/2005 | Hayashi et al. | |

FOREIGN PATENT DOCUMENTS

| | | |
|---|---|---|
| JP | 9-92705 | 4/1997 |
| JP | 10-326844 | 12/1998 |
| JP | 2000-58523 | 2/2000 |
| JP | 2004-311887 | 11/2004 |
| JP | 2004-342704 | 12/2004 |
| WO | WO00/60653 | 10/2000 |
| WO | WO 01/88971 A1 | 11/2001 |

* cited by examiner

*Primary Examiner*—Parviz Hassanzadeh
*Assistant Examiner*—Tiffany Nuckols
(74) *Attorney, Agent, or Firm*—Oblon, Spivak, McClelland, Maier & Neustadt, L.L.P.

(57) ABSTRACT

A substrate processing apparatus which enables the work efficiency of maintenance to be improved. The substrate processing apparatus comprises a plurality of processing chambers 100 for carrying out plasma processing on a wafer to be processed. Each processing chamber 100 has a chamber lid 200 that can be suspended and supported by a crane unit 500. The crane unit 500 comprises an air cylinder 510 and a linear guide 520. The air cylinder 510 holds the chamber lid 200 movably in a vertical direction thereabove. The linear guide 520 holds the chamber lid 200 movably in a horizontal direction.

14 Claims, 11 Drawing Sheets

SUBSTRATE PROCESSING APPARATUS AND LID SUPPORTING APPARATUS FOR THE SUBSTRATE PROCESSING APPARATUS

BACKGROUND OF THE INVENTION

1. Field of the Invention

The present invention relates to a substrate processing apparatus, and a lid supporting apparatus for the substrate processing apparatus, and more particularly to a substrate processing apparatus having processing chambers in which predetermined processing is carried out on substrates to be processed, and a lid supporting apparatus for the substrate processing apparatus.

2. Description of the Related Art

Among substrate processing apparatuses for manufacturing semiconductor devices, there are plasma processing apparatuses having processing chambers in which plasma processing such as etching processing using plasma is carried out on semiconductor wafers (hereinafter referred to merely as "wafers") as substrates to be processed. Each processing chamber has in an upper portion thereof a chamber upper lid for closing up the processing chamber (see, for example, Japanese Laid-open Patent Publication (Kokai) No. 2004-311887, Japanese Laid-open Patent Publication (Kokai) No. 2000-058523, the specification of U.S. Pat. No. 6,719,851, and the gazette (leaflet) of International Patent Publication No. WO/2000/060653). In such a substrate processing apparatus, by moving the chamber upper lid away from the processing chamber, cleaning of an entire surface of the chamber upper lid and an inner surface of the processing chamber, and maintenance such as as dismantling and remodeling the processing chamber can be carried out.

The chamber upper lid described in Japanese Laid-open Patent Publication (Kokai) No. 2004-311887 is constructed such as to be raised and lowered along four guide poles provided upright in a vertical direction from a processing chamber, this being in an exposing apparatus using an electron beam (an EB apparatus).

The chamber upper lid described in each of Japanese Laid-open Patent Publication (Kokai) No. 2000-058523 and U.S. Pat. No. 6,719,851 is of a so-called cantilever up/down driving type in which an end portion of the chamber upper lid is supported such as to be able to be raised and lowered by two guide members provided upright in a vertical direction, and is pivoted such as to be rotatable by a hinge portion.

A plate as the chamber upper lid described in International Patent Publication No. 00/060653 is of a sliding type in which an upper surface of the plate is supported by an arm that projects out in a horizontal direction from a side surface of an upper portion of a drive shaft as a single guide member that is provided upright in a vertical direction, and the plate can move up/down in a vertical direction and rotate (slide) in the horizontal direction.

However, with the art described in above Japanese Laid-open Patent Publication (Kokai) No. 2004-311887, Japanese Laid-open Patent Publication (Kokai) No. 2000-058523, U.S. Pat. No. 6,719,851, and International Patent Publication No. 00/060653, it is necessary to provide at least one guide member for supporting the chamber upper lid; such a guide member interferes with pillars as a frame for providing a wall for surrounding the processing chamber, or with other adjacent processing chambers. Moreover, with the art described in above Japanese Laid-open Patent Publication (Kokai) No. 2004-311887 in particular, the four guide poles as the frame interfere with the chamber upper lid, and hence the chamber upper lid cannot be moved in a horizontal direction. As a result, when, for example, removing component parts from inside the processing chamber during remodeling, even if the chamber upper lid is raised to the highest position on the guide poles, interference occurs between the component parts and the chamber upper lid or the guide poles.

In addition, in recent years, as the diameter of wafers has been increased, the size of substrate processing apparatuses has been increased. As a result, firstly, the space around each processing chamber has become further reduced, and hence it has become difficult to secure space in which to provide guide members as described above, or space for rotating the chamber upper lid in a horizontal direction as in the art described in above International Patent Publication No. 00/060653. Secondly, as a substrate processing apparatus becomes larger in size, the chamber upper lid also becomes larger in size and thus heavier in weight, and hence the hinge portion or guide members as described in above Japanese Laid-open Patent Publication (Kokai) No. 2000-058523, U.S. Pat. No. 6,719, 851, or International Patent Publication No. 00/060653 are small in number to support a heavy chamber upper lid in a well balanced way.

Among inner chamber-component parts disposed inside a processing chamber as described above, there are a deposit shield and a stage unit. The deposit shield is disposed along an inner surface of a side wall of the processing chamber and acts as an inner wall protecting member to which deposit becomes attached instead of the inner surface of the side wall of the processing chamber. The stage unit is constituted from a stage (susceptor) that acts as an ESC (electrostatic chuck) to which a wafer is electrostatically attracted (chucked) and associated component parts. However, the deposit shield has a large dimension in a height direction, and hence upon trying to remove the deposit shield from the processing chamber in a vertical direction, there is a problem of interference between a lower portion of the deposit shield and the side wall of the processing chamber. While the stage unit is very heavy, and hence there is a problem that removing the stage unit during remodeling is difficult.

In view of foregoing, there are demands to improve the work efficiency of maintenance such as cleaning and remodeling.

SUMMARY OF THE INVENTION

It is an object of the present invention to provide a substrate processing apparatus, and a lid supporting apparatus for the substrate processing apparatus, that enable the work efficiency of maintenance to be improved.

To attain the above object, in a first aspect of the present invention, there is provided a substrate processing apparatus comprising at least one processing chamber in which predetermined processing is carried out on a substrate to be processed, the processing chamber having provided in an upper portion thereof a processing chamber upper lid for closing up the processing chamber, and a lid supporting mechanism that suspends and supports the processing chamber upper lid, and the lid supporting mechanism comprises a vertical movement regulating portion that holds the processing chamber upper lid movably in a vertical direction thereabove, and a horizontal movement regulating portion that holds the processing chamber upper lid movably in a predetermined horizontal direction, and the horizontal movement regulating portion suspends and supports the processing chamber upper lid via the vertical movement regulating portion.

According to the above construction, the lid supporting mechanism that suspends and supports the processing chamber upper lid comprises a vertical movement regulating portion that holds the processing chamber upper lid movably in a vertical direction thereabove, and a horizontal movement regulating portion that holds the processing chamber upper lid movably in a predetermined horizontal direction. As a result, the processing chamber upper lid can be moved in the vertical direction thereabove, and in the predetermined horizontal direction, and hence the work efficiency of maintenance such as cleaning and remodeling can be improved.

Preferably, the vertical movement regulating portion comprises an air cylinder that is extensible in the vertical direction.

According to the above construction, the vertical movement regulating portion comprises an air cylinder that is extensible in the vertical direction. As a result, the processing chamber upper lid can be moved in the vertical direction with high controllability.

Preferably, the horizontal movement regulating portion comprises a linear guide provided extending in the horizontal direction.

According to the above construction, the horizontal movement regulating portion comprises a linear guide provided extending in the horizontal direction. As a result, the processing chamber upper lid can be moved in the horizontal direction with high controllability.

Preferably, the substrate processing apparatus further comprises a controller that controls a position to which the processing chamber upper lid is moved.

According to the above construction, the substrate processing apparatus further comprises a controller that controls the position to which the processing chamber upper lid is moved. As a result, the movement of the processing chamber upper lid can be operated remotely, and hence the work efficiency of maintenance can be further improved.

Preferably, the processing chamber upper lid has formed therein at least one hole into which is fitted a joining member that joins the processing chamber upper lid to at least one inner processing chamber-component part disposed inside the processing chamber.

According to the above construction, the processing chamber upper lid has formed therein at least one hole into which is fitted a joining member that joins the processing chamber upper lid to at least one inner processing chamber-component part. As a result, the inner processing chamber-component part can be moved using the lid supporting mechanism, and hence the work efficiency of maintenance can be markedly improved.

Preferably, the at least one inner processing chamber-component part comprises at least one of an upper electrode that supplies electrical power required for the predetermined processing into the processing chamber, and an inner wall protecting member that at least partially protects an inner surface of the processing chamber.

According to the above construction, the at least one inner processing chamber-component part comprises at least one of an upper electrode and an inner wall protecting member. As a result, inner processing chamber-component part that is difficult to move manually can be moved.

Preferably, the substrate processing apparatus further comprises a stage unit including a stage for mounting the substrate to be processed provided inside the processing chamber, and wherein the vertical movement regulating portion is constructed such that at least an end portion thereof on a side of the processing chamber upper lid can be replaced with a removing jig for removing the stage unit from the processing chamber.

According to the above construction, the vertical movement regulating portion is constructed such as to be replaceable with a removing jig for removing the stage unit from the processing chamber. As a result, a very heavy stage unit can be removed from the processing chamber using the lid supporting mechanism, and hence the work efficiency of maintenance can be markedly improved.

To attain the above object, in a second aspect of the present invention, there is provided a substrate processing apparatus comprising at least one processing chamber in which predetermined processing is carried out on a substrate to be processed, the processing chamber having provided in an upper portion thereof a processing chamber upper lid for closing up the processing chamber, and a lid supporting mechanism that suspends and supports the processing chamber upper lid, and the lid supporting mechanism comprises an air cylinder that is extensible in a vertical direction for holding the processing chamber upper lid movably in the vertical direction thereabove, and a linear guide provided extending in a predetermined horizontal direction for holding the processing chamber upper lid movably in the horizontal direction, and the linear guide suspends and supports the processing chamber upper lid via the air cylinder.

According to the above construction, the lid supporting mechanism that suspends and supports the processing chamber upper lid comprises an air cylinder that is extensible in a vertical direction for holding the processing chamber upper lid movably in the vertical direction thereabove, and a linear guide provided extending in a predetermined horizontal direction for holding said processing chamber upper lid movably in the horizontal direction. As a result, the processing chamber upper lid can be moved in the vertical direction thereabove, and in the predetermined horizontal direction, and hence the work efficiency of maintenance such as cleaning and remodeling can be improved.

Preferably, the substrate processing apparatus further comprises a controller that controls a position to which the processing chamber upper lid is moved.

According to the above construction, the substrate processing apparatus further comprises a controller that controls the position to which the processing chamber upper lid is moved. As a result, the movement of the processing chamber upper lid can be operated remotely, and hence the work efficiency of maintenance can be further improved.

Preferably, the processing chamber upper lid has formed therein at least one hole into which is fitted a joining member that joins the processing chamber upper lid to at least one inner processing chamber-component part disposed inside the processing chamber.

According to the above construction, the processing chamber upper lid has formed therein at least one hole into which is fitted a joining member that joins the processing chamber upper lid to at least one inner processing chamber-component part. As a result, the inner processing chamber-component part can be moved using the lid supporting mechanism, and hence the work efficiency of maintenance can be markedly improved.

Preferably, the at least one inner processing chamber-component part comprises at least one of an upper electrode that supplies electrical power required for the predetermined processing into the processing chamber, and an inner wall protecting member that at least partially protects an inner surface of the processing chamber.

According to the above construction, the at least one inner processing chamber-component part comprises at least one of an upper electrode and an inner wall protecting member. As a result, inner processing chamber-component parts that are difficult to move manually can be moved.

Preferably, the substrate processing apparatus further comprises a stage unit including a stage for mounting the substrate to be processed provided inside the processing chamber, and the air cylinder is constructed such that at least an end portion thereof on a side of the processing chamber upper lid can be replaced with a removing jig for removing the stage unit from the processing chamber.

According to the above construction, the air cylinder is constructed such as to be replaceable with a removing jig for removing the stage unit from the processing chamber. As a result, a very heavy stage unit can be removed from the processing chamber using the lid supporting mechanism, and hence the work efficiency of maintenance can be markedly improved.

To attain the above object, in a third aspect of the present invention, there is provided a lid supporting apparatus that suspends and supports a processing chamber upper lid provided in an upper portion of at least one processing chamber of a substrate processing apparatus in which predetermined processing is carried out on a substrate to be processed, the processing chamber upper lid being for closing up the processing chamber, the lid supporting apparatus comprising a vertical movement regulating portion that holds the processing chamber upper lid movably in a vertical direction thereabove, and a horizontal movement regulating portion that holds the processing chamber upper lid movably in a predetermined horizontal direction, the horizontal movement regulating portion suspends and supports the processing chamber upper lid via the vertical movement regulating portion.

According to the above construction, the lid supporting apparatus that suspends and supports the processing chamber upper lid comprises a vertical movement regulating portion that holds the processing chamber upper lid movably in a vertical direction thereabove, and a horizontal movement regulating portion that holds the processing chamber upper lid movably in a predetermined horizontal direction. As a result, the processing chamber upper lid can be moved in the vertical direction thereabove, and in the predetermined horizontal direction, and hence the work efficiency of maintenance such as cleaning and remodeling can be improved.

Preferably, the vertical movement regulating portion comprises an air cylinder that is extensible in the vertical direction.

According to the above construction, the vertical movement regulating portion comprises an air cylinder that is extensible in the vertical direction. As a result, the processing chamber upper lid can be moved in the vertical direction with high controllability.

Preferably or more preferably, the horizontal movement regulating portion comprises a linear guide provided extending in the horizontal direction.

According to the above construction, the horizontal movement regulating portion comprises a linear guide provided extending in the horizontal direction. As a result, the processing chamber upper lid can be moved in the horizontal direction with high controllability.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

Figure 1:
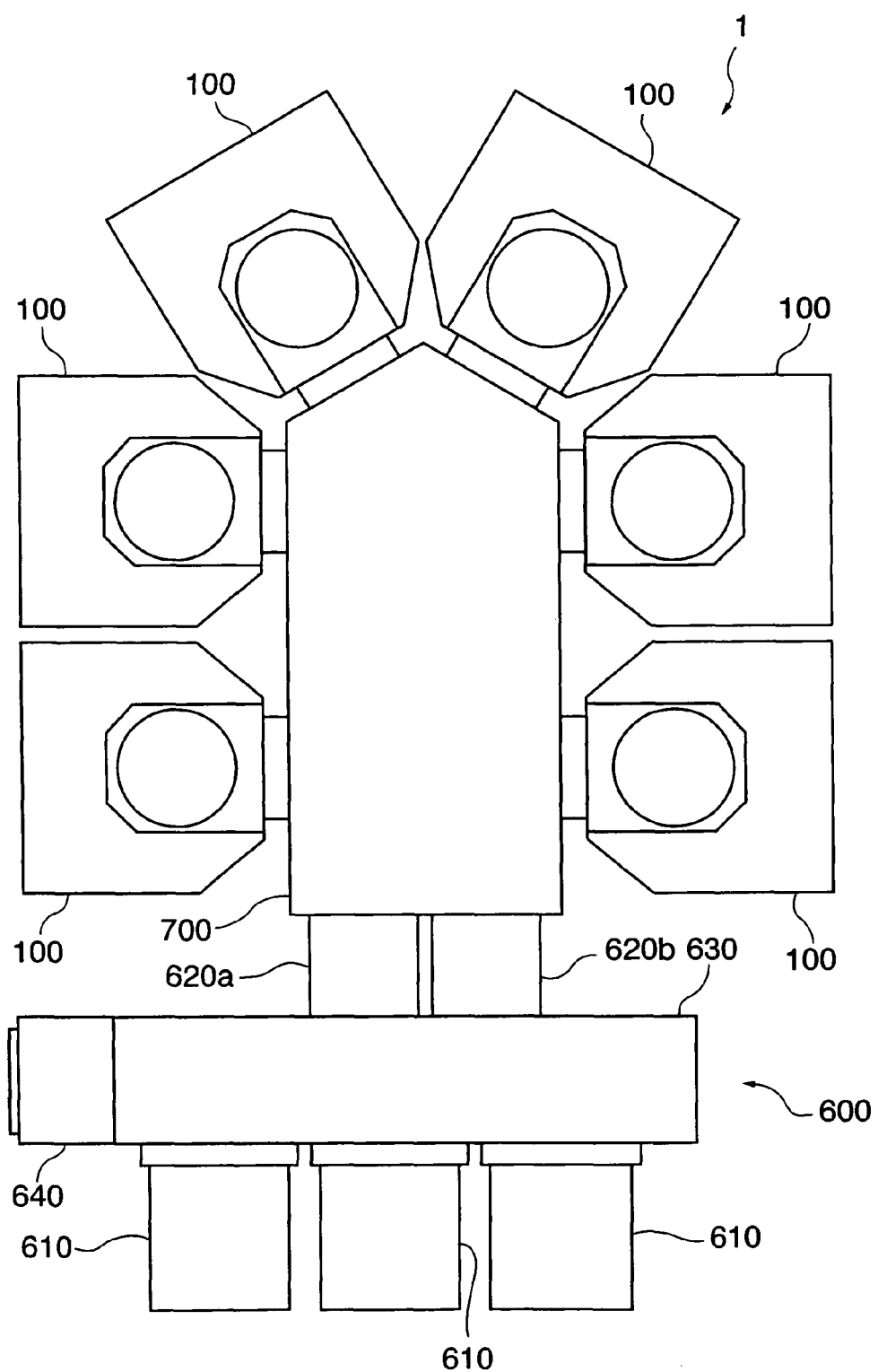
FIG. 1 is a plan view schematically showing the construction of a substrate processing apparatus according to an embodiment of the present invention.

FIG. 1 is a plan view schematically showing the construction of a substrate processing apparatus according to an embodiment of the present invention.

As shown in FIG. 1, the substrate processing apparatus 1 is comprised of six processing chambers (P/C's) 100 for carrying out plasma processing such as RIE (reactive ion etching) processing or ashing processing one at a time on wafers having a diameter of, for example, 300 mm as objects to be processed, a substrate transfer unit 600 for transferring in and out unprocessed wafers and transferring in and out wafers that have been processed in the P/C's 100, and a transfer chamber (T/C) 700 for transferring wafers between the P/C's 100 and the substrate transfer unit 600. Each of the P/C's 100 is connected to the T/C 700.

The substrate transfer unit 600 has three FOUP mounting stages 610 on each of which can be mounted a FOUP (front opening unified pod) which is a container housing wafers, load lock chambers (L/L chambers) 620a and 620b connected to the T/C 700, loader unit 630 for transferring wafers under atmospheric pressure, disposed between the FOUP mounting stages 610 and the L/L chambers 620a and 620b, an orienter 640 as a pre-alignment (P/A) unit for positioning or pre-aligning the wafers, and two non-product substrate FOUPs (not shown) that are attached to a longitudinal side of the loader unit 630 below the L/L chambers 620a and 620b. Each of the FOUPs on the FOUP mounting stages 610 houses, for example, twenty-five wafers, and each of the non-product substrate FOUPs housed a predetermined number of non-product substrates for dummy processing (dummy wafers) used during trial operation of the substrate processing apparatus 1 and the like.

According to the substrate processing apparatus 1 shown in FIG. 1, because there are six of the P/C's 100, substrate processing can be carried out simultaneously on a plurality of wafers.

Figure 2:
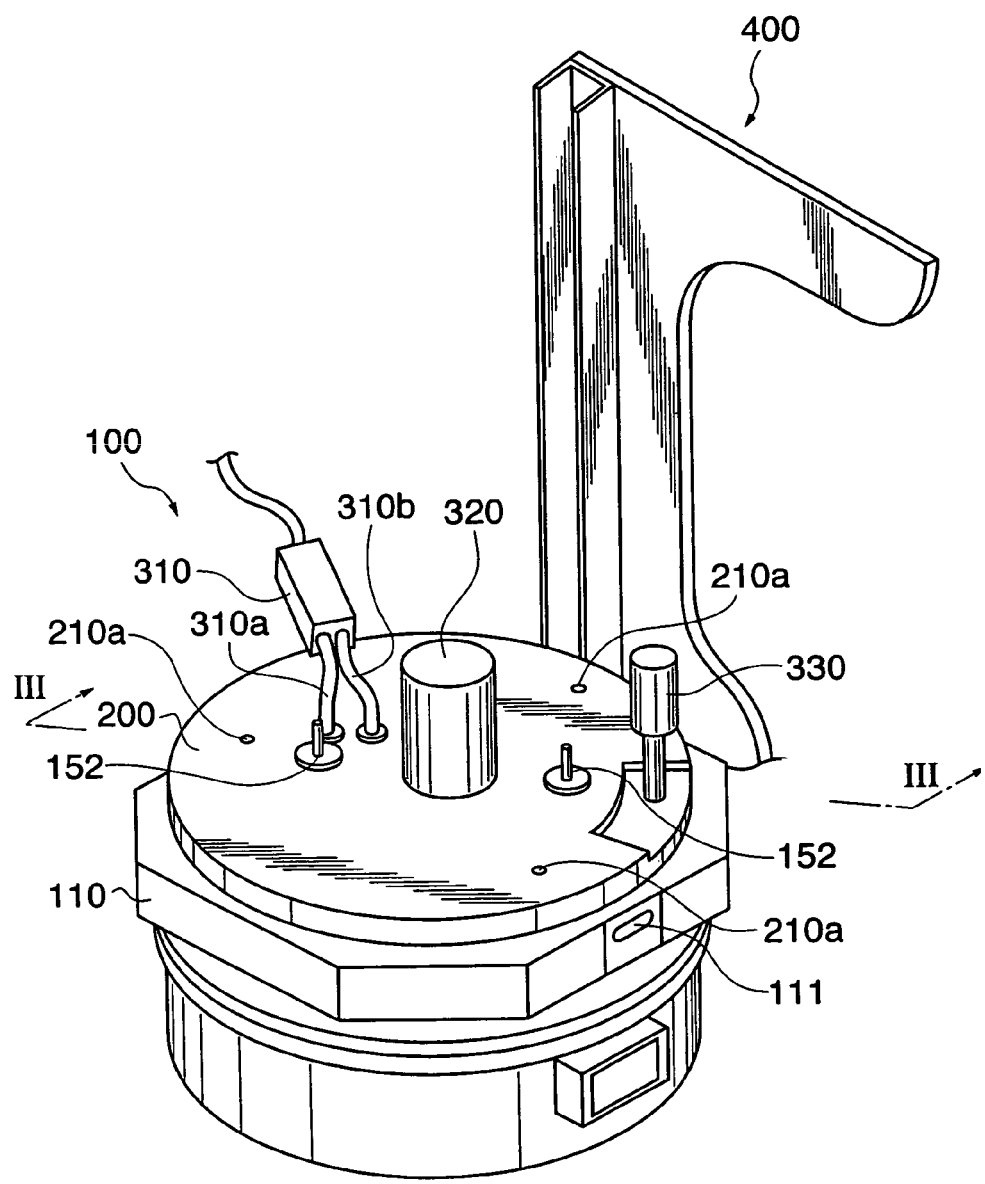
FIG. 2 is a perspective view schematically showing the external appearance of a processing chamber appearing in FIG. 1.

FIG. 2 is a perspective view schematically showing the external appearance of one of the P/C's 100 appearing in FIG. 1.

As shown in FIG. 2, each P/C 100 is provided with a P/C casing 110 having an opening in an upper portion thereof, and a chamber lid 200 as a upper lid for closing up the P/C casing 110. The P/C casing 110 has an EPP window 111 provided therein. Moreover, on both sides of the P/C 100 is disposed a frame 400 constructed from walls for surrounding the P/C 100 and pillars that supports the walls. The frame 400 also includes a ceiling plate disposed above the P/C 100.

Above the chamber lid 200 there are disposed component parts including a gas box 310 for supplying a processing gas into the P/C 100, a DC filter box 320 having provided therein a DC filter for blocking leakage of RF electrical power, described below, into a DC power source 49 that supplies DC electrical power, described below, so that the DC power source 49 is not damaged, but allowing the DC electrical power to pass, and a pressure measuring instrument 330 that measures an inner pressure of the P/C 100. The gas box 310 is provided with a flow splitter for splitting a flow path of the processing gas into two processing gas supply pipes 310a and 310b, and a mass flow controller (MFC) that controls the flow rate of the processing gas to be supplied into the two processing gas supply pipes 310a and 310b. The processing gas supply pipes 310a and 310b each penetrate through the chamber lid 200 so as to communicate with a space inside the P/C 100. The DC filter box 320 is connected to an upper surface of the chamber lid 200. Moreover, vent holes are provided in the DC filter box 320.

The chamber lid 200 has, for example, three screw holes 210a formed therein. The number of screw holes 210a formed may be any number from two upwards. Each of the screw holes 210a has a screw fitted thereinto as required, the screws acting as joining members for joining the chamber lid 200 to a deposit shield 130 shown in FIG. 3, described below.

Figure 3:
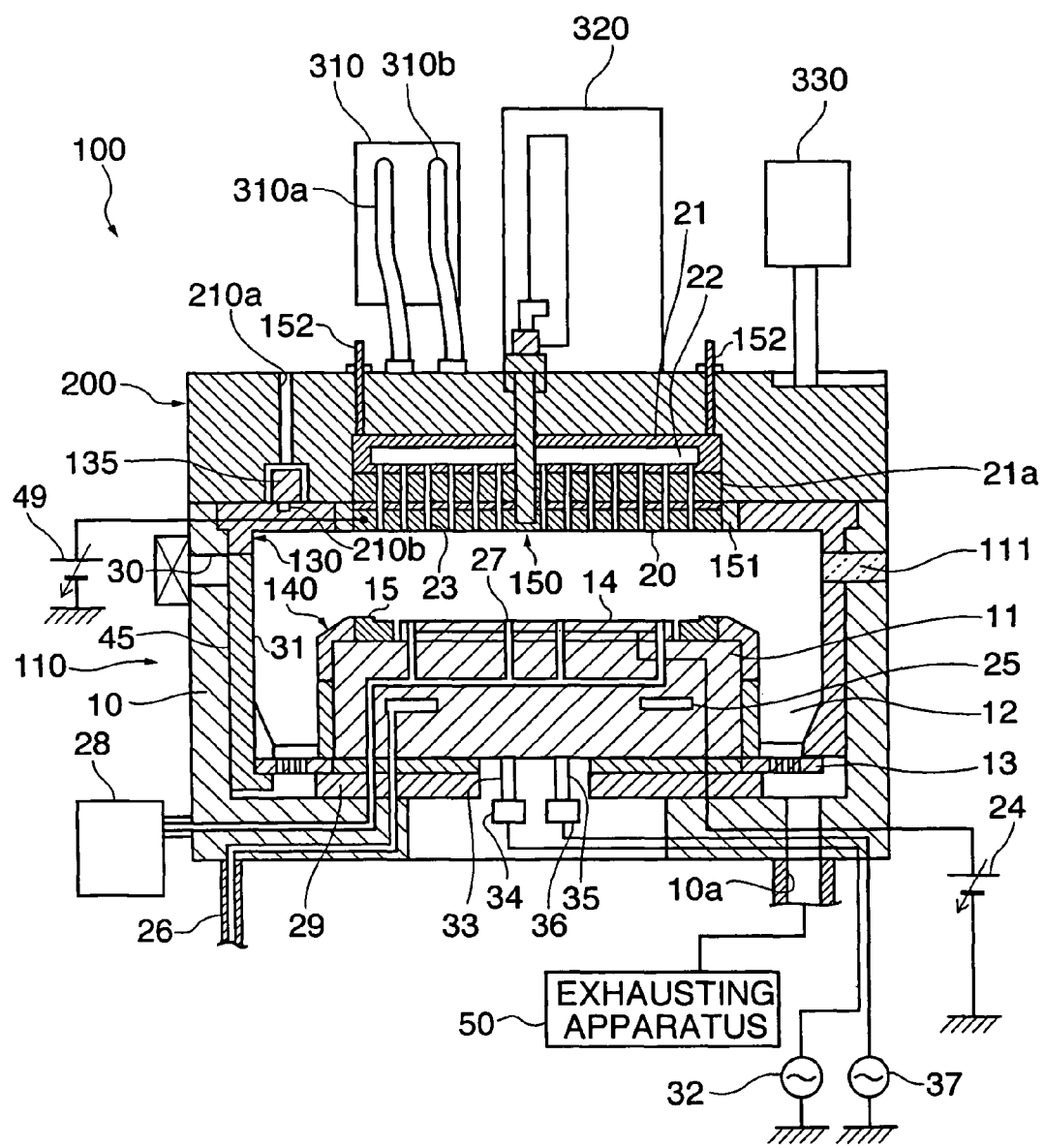
FIG. 3 is a sectional view taken along line III-III in FIG. 2.

FIG. 3 is a sectional view taken along line III-III in FIG. 2, and schematically shows the construction of the inside of the P/C 100.

As shown in FIG. 3, the P/C 100 has a hollow cylindrical side wall 10 made of aluminum having an inner surface thereof coated with alumite, and the deposit shield 130 which is substantially hollow cylindrical and is disposed along the inner surface of the side wall 10. A component part 135 such as a temperature adjusting unit and a water-passing pipe is disposed on an upper surface of the deposit shield 130.

Below a space defined by the deposit shield 130 (hereinafter referred to as the "reaction space") is disposed a stage unit 140 including a substantially cylindrical stage (susceptor) 11 on which a wafer is mounted, and above the reaction space is disposed an upper electrode assembly 150 including an upper electrode, described below. The upper electrode assembly 150 is disposed such as to face the stage unit 140. The upper electrode assembly 150 contacts a bottom surface of the chamber lid 200 and is detachable from the chamber lid 200. Moreover, the P/C 100 is electrically grounded, and the stage 11 is installed via an insulating member 29 disposed on a bottom portion of the P/C 100.

In the P/C 100, an exhaust path 12 that acts as a flow path through which gas molecules above the stage unit 140 are exhausted to the outside of the P/C 100 is formed between the inner surface of the side wall 10 and a side surface of the stage unit 140. An annular baffle plate 13 that prevents plasma leakage is disposed part way along the exhaust path 12. Moreover, a space (exhaust chamber (manifold)) in the exhaust path 12 downstream of the baffle plate 13 is communicated with an exhausting apparatus 50 such as an exhausting pump (not shown) via an exhaust port 10a formed in the side wall 10. As a result, the pressure inside the P/C 100 can be controlled, for example the pressure inside the P/C 100 can be reduced down to a substantially vacuum state.

A radio frequency power source 32 is connected to the stage 11 via a feeder rod 33 and a matcher 34. The radio frequency power source 32 supplies radio frequency electrical power (RF electrical power) of a relatively high frequency, for example 40 MHz, to the stage 11. The stage 11 thus acts as a lower electrode. The matcher 34 reduces reflection of the RF electrical power from the stage 11, so as to maximize the efficiency of the supply of the RF electrical power into the stage 11. The stage 11 applies the 40 MHz RF electrical power supplied from the radio frequency power source 32 into the reaction space. At this time, a potential due to the applied RF electrical power is produced in the reaction space.

Moreover, another radio frequency power source 37 is connected to the stage 11 via a feeder rod 35 and a matcher 36. The other radio frequency power source 37 supplies RF electrical power of a relatively low frequency, for example 2 MHz, to the stage 11. The matcher 36 has a similar function to the matcher 34.

A radio frequency (2 MHz) potential due to the supplied 2 MHz RF electrical power is produced on the stage 11, particularly a surface thereof. Moreover, a potential due to the supplied 40 MHz RF electrical power is also produced on the surface of the stage 11.

A disk-shaped ESC electrode plate 14 having an electrically conductive film therein is disposed in an upper portion of the stage unit 140. An ESC DC power source 24 is electrically connected to the ESC electrode plate 14. A wafer is attracted to and held on an upper surface of the ESC electrode plate 14 through a Johnsen-Rahbek force or a Coulomb force generated by a DC voltage applied to the ESC electrode plate 14 from the ESC DC power source 24. Moreover, an annular focus ring 15 is provided on a side portion of the stage unit 140 so as to surround the wafer attracted to and held on the upper surface of the ESC electrode plate 14. The focus ring 15 is exposed to the reaction space, and focuses plasma in the reaction space toward a surface of the wafer, thus improving the efficiency of the plasma processing.

Moreover, an annular coolant chamber 25 that extends, for example, in a circumferential direction of the stage 11 is provided inside the stage 11. A coolant, for example cooling water or a Galden™ fluid, at a predetermined temperature is circulated into the coolant chamber 25 from a chiller unit (not shown) via coolant piping 26. A processing temperature of the wafer attracted to and held on the upper surface of the ESC electrode plate 14 is controlled through the temperature of the coolant.

Furthermore, a plurality of heat-transmitting gas supply holes 27 are provided in a portion of the upper surface of the ESC electrode plate 14 (the stage unit 140) on which the wafer is attracted and held (hereinafter referred to as the "attracting surface"). The heat-transmitting gas supply holes 27 are connected to a heat-transmitting gas supply unit 28. The heat-transmitting gas supply unit 28 supplies helium gas as a heat-transmitting gas via the heat-transmitting gas supply holes 27 into a gap between the attracting surface of the stage unit 140 and a rear surface of the wafer.

A plurality of, for example three, pusher pins (not shown) are provided in the attracting surface of the stage unit 140 as lifting pins that can be made to project out from the upper surface of the stage unit 140. The pusher pins are housed in the stage unit 140 when a wafer is being attracted to and held on the attracting surface of the stage unit 140 so that the wafer can be subjected to the plasma processing, and are made to project out from the upper surface of the stage unit 140 so as to lift the wafer up away from the ESC electrode plate 14 when the wafer is to be transferred out from the P/C 100 after having been subjected to the plasma processing.

The upper electrode assembly 150 has a shower head 20 that faces the stage unit 140 and has a large number of gas holes 23 therein, an electrode support 21 on which the shower head 20 is detachably supported, an annular shield ring 151 that is disposed at a contacting portion where the upper electrode assembly 150 contacts the deposit shield 130, and a plurality of screws 152 that join the chamber lid 200 and the upper electrode assembly 150 together. The DC power source 49 that supplies predetermined DC electrical power is connected to the shower head 20, whereby the shower head 20 acts as an upper electrode. The electrode support 21 has formed therein a buffer chamber 22 to which the processing gas supply pipes 310a and 310b are connected and into which the processing gas is supplied, and moreover has a cooling plate 21a that closes up a lower portion of the buffer chamber 22. The shower head 20 supplies into the P/C 100 via the gas holes 23 the processing gas supplied into the buffer chamber 22 from the processing gas supply pipes 310a and 310b.

Moreover, a transfer port 30 for the wafers is provided in the side wall 10 of the P/C 100 in a position at the height of a wafer that has been lifted up by the pusher pins. A shutter 31 constructed so as to be able to be raised and lowered to open and close the transfer port 30 is provided in the transfer port 30.

In the P/C 100, upon supplying RF electrical power to the stage unit 140 acting as the lower electrode, and supplying DC electrical power to the upper electrode assembly 150 acting as the upper electrode, and thus applying electrical power into the reaction space between the stage unit 140 and the upper electrode assembly 150 as described above, high-density plasma is produced from the processing gas supplied into the reaction space from the shower head 20, whereby the wafer is subjected to the plasma processing by the plasma.

Specifically, when subjecting a wafer to the plasma processing, first the shutter 31 is opened, and the wafer to be subjected to the plasma processing is transferred into the P/C 100, and attracted to and held on the attracting surface of the stage 11 by applying an ESC voltage to the ESC electrode plate 14. Moreover, the processing gas (e.g. a mixed gas comprised of $CF_4$ gas, $O_2$ gas and Ar gas with a predetermined flow rate ratio therebetween) is supplied into the P/C 100 at a predetermined flow rate from the shower head 2b, and the pressure inside the P/C 100 is controlled to a predetermined value. Furthermore, RF electrical power and DC electrical power are applied into the reaction space in the P/C 100 from the stage unit 140 and the upper electrode assembly 150. The processing gas introduced in from the shower head 20 is thus made into plasma in the reaction space. The plasma is focused onto the surface of the wafer by the focus ring 15, whereby the surface of the wafer is physically/chemically etched.

Figure 4:
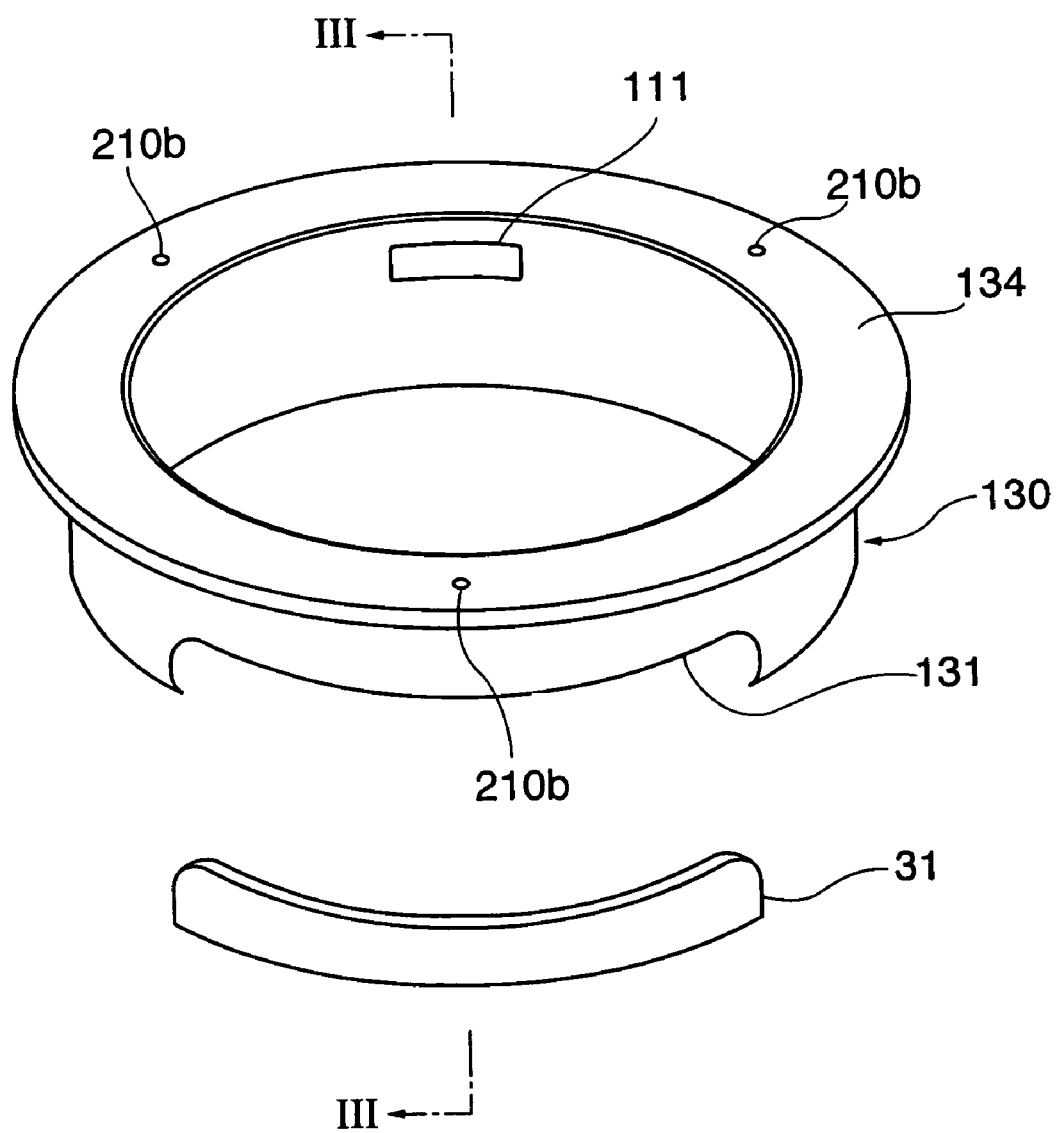
FIG. 4 is a perspective view showing the external appearance of a deposit shield and a shutter appearing in FIG. 3.

FIG. 4 is a perspective view showing the external appearance of the deposit shield 130 and the shutter 31 appearing in FIG. 3.

As shown in FIG. 4, the deposit shield 130 has a substantially hollow cylindrical shape of height 150 mm and outside diameter 670 mm along an upper portion of the inner surface of the side wall 10 of the P/C 100, and acts as an inner wall protecting member that protects the side wall 10 by preventing deposit from becoming attached to the inner surface of the side wall 10. Moreover, a cutout portion 131 having a width greater than the diameter of the wafer in a width direction thereof is formed in part of a lower portion of the deposit shield 130. A surface of the cutout of the cutout portion 131 has a shape complementary to that of an upper surface of the shutter 31. The shutter 31 is made of the same material as the deposit shield 130.

Moreover, the deposit shield 130 has formed in a peripheral edge flange 134 thereof screw holes 210b formed such as to correspond to the screw holes 210a in the chamber lid 200. The screw holes 210b are formed such as to not penetrate through the peripheral edge flange 134 of the deposit shield 130. The component part 135 appearing in FIG. 3 is disposed above one of the screw holes 210b. Moreover, plate-like heaters (not shown) extending in two lines are disposed inside the peripheral edge flange 134 of the deposit shield 130.

Figure 5:
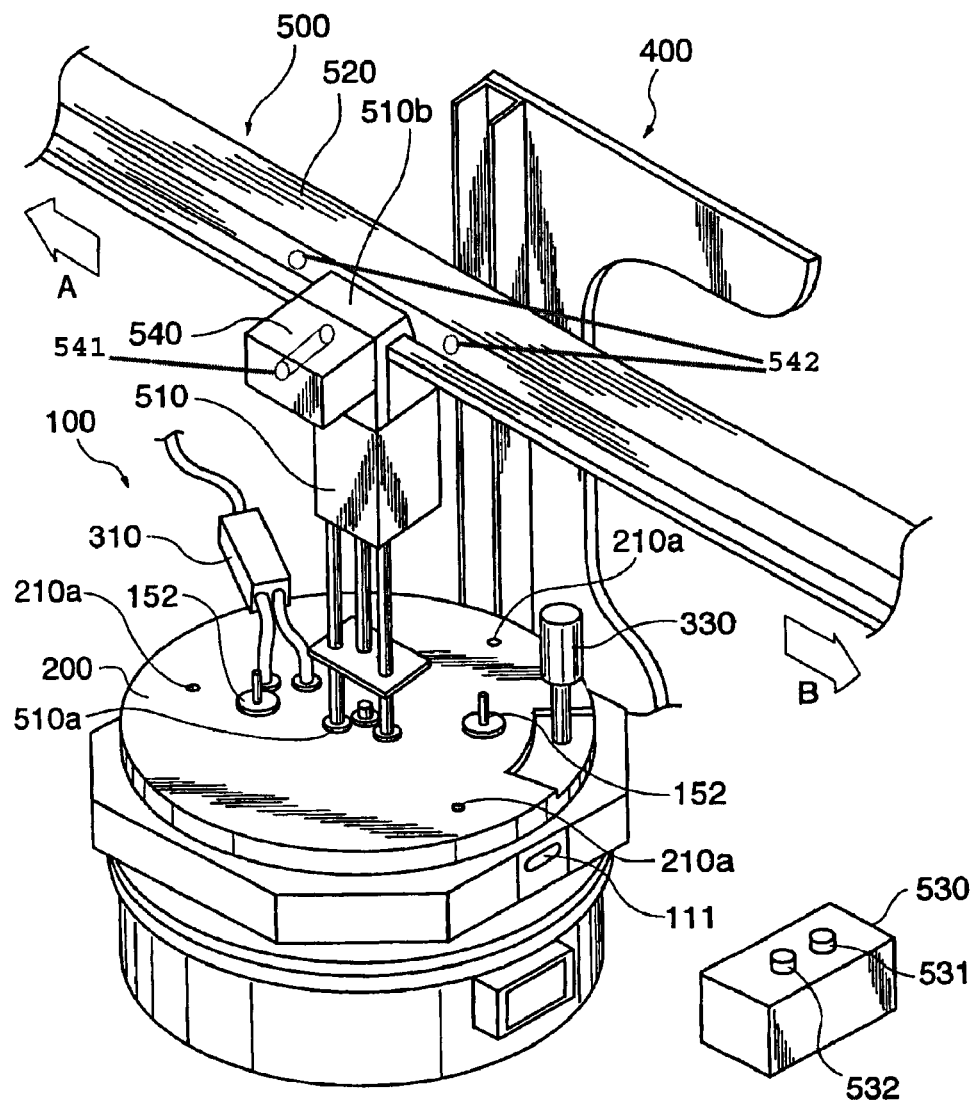
FIG. 5 is a perspective view showing the external appearance of the processing chamber onto which a crane unit has been installed after a DC filter box appearing in FIG. 2 has been removed.

FIG. 5 is a perspective view showing the external appearance of the P/C 100 onto which a crane unit has been installed after the DC filter box 320 appearing in FIG. 2 has been removed. Note that the T/C 700 appearing in FIG. 1 is disposed in the direction of the arrow A in FIG. 5, and a maintenance table (not shown) used when a user carries out maintenance and so on is disposed in the direction of the arrow B.

As shown in FIG. 5, the crane unit 500 is joined to (installed on) the chamber lid 200 after the DC filter box 320 disposed on the chamber lid 200 has been removed. As a result, the crane unit 500 can open and close the chamber lid 200 of the P/C 100. Note that the gas box 310 and the like may also be removed as required.

The crane unit 500 is comprised of an air cylinder 510 one end 510a of which is joined to the chamber lid 200, and a linear guide 520 to which is engaged another end 510b of the air cylinder 510 so as to be slidable along a rail of the linear guide 520. The air cylinder 510 holds the chamber lid 200, and the linear guide 520 holds the air cylinder 510, whereby the crane unit 500 acts as a lid supporting mechanism that suspends and supports the chamber lid 200.

The linear guide 520 is fixed to the ceiling plate of the frame 400 in a manner to extend in the directions of the arrows A and B in FIG. 5 in a horizontal plane parallel to a wafer transfer direction. The height of the ceiling plate is between 2000 and 2300 mm. The rail length of the linear guide 520 is set as appropriate in accordance with the diameter of the chamber lid 200 and so on, being for example 1600 mm so that the chamber lid 200 can be offset by a length corresponding to the diameter of the chamber lid 200 (780 mm) in each of the directions of the arrows A and B. As a result, the linear guide 520 acts as a horizontal movement regulating portion that movably holds the chamber lid 200 over a range corresponding to the length of the rail extending in the directions of the arrows A and B.

The air cylinder 510 is constructed such as to be extensible in a vertical direction, and acts as a vertical movement regulating portion that suspends and supports the chamber lid 200 from above the chamber lid 200, by using a so-called suspending method, over a range up to the height of the ceiling plate. Because such a suspending method is used, the risk of jamming occurring due to the air cylinder 510 being subjected to a load from above can be eliminated. Furthermore, even in the case that the size of the P/C 100 is changed in accordance with the wafer diameter, and hence the diameter of the chamber lid 200 is changed, because the suspending method is used, there is no need to change the construction of the crane unit 500. In other words, there is no reduction in the degree of freedom to change the wafer diameter or change the size of the P/C 100.

As the air cylinder 510, one of any chosen stroke length can be used, although it is preferable to select a stroke length such that the chamber lid 200 is not pushed excessively against the upper surface of the P/C 100.

The air cylinder 510 is preferably such that operation thereof can be stopped at any intermediate point along the stroke length, whereby a user can carry out maintenance on the chamber lid 200 or the upper electrode assembly 150 at a desired height. Moreover, the air cylinder 510 is constructed such as to operate at low speed immediately before closing of the chamber lid 200, whereby catching of a user's finger, wiring or the like obstructing a space between the chamber lid 200 and the P/C casing 110 can be prevented, and hence the safety of the substrate processing apparatus 1 can be improved.

The end 510a of the air cylinder 510 is joined to the upper surface of the chamber lid 200 via a predetermined joining member at a position displaced by a predetermined amount from a central position of the upper surface of the chamber lid 200. By displacing by the predetermined amount, when the chamber lid 200 is suspended and supported, the chamber lid 200 is deliberately tilted. As a result, backlash can be conferred, and hence shock arising when opening/closing the chamber lid 200 can be alleviated, which makes it possible to carry out the opening/closing of the chamber lid 200 smoothly.

The crane unit 500 further has a controller 530 that remotely controls the position and operation of the air cylinder 510 and hence a position to which the chamber lid 200 is moved, and a positioning box 540 that is moved with the air cylinder 510. The positioning box 540 is provided with at least one positioning pin 541, and corresponding to this, pinholes 542 are formed in a plurality of places, for example three places at one end, in the center, and at the another end, on the rail of the linear guide 520 so as to engage the positioning pin 541. As a result, a locking mechanism is constructed, and hence the safety of the substrate processing apparatus 1 can be improved in accidental operation of the crane unit 500. When the positioning pin 541 engages with the central pinhole out of the three places, it can be easily discerned that the end 510a of the air cylinder 510 and the upper surface of the chamber lid 200 are able to be joined together. Note that an object to be engaged into the pinholes is not limited to being the positioning pin, but rather may alternatively be a taper shaft or the like.

The controller 530 is provided with an up button 531 and a down button 532 that control the position of the air cylinder 510 in the vertical (up/down) direction. The up and down buttons 531 and 532 are preferably constructed such as to be operable when the positioning pin of the positioning box 540 is engaged into a pin hole, and to be inoperable when the positioning pin is not engaged into a pin hole, whereby the ease of operation for the user can be improved. Furthermore, according to such up and down buttons 531 and 532, the occurrence of an accident due to up/down movement of the air cylinder 510 other than in a desired position can be prevented, and hence the safety of the substrate processing apparatus 1 can be improved. Note that when releasing the positioning pin from being locked in a pin hole, a predetermined lever (not shown) is used. Moreover, by constructing the substrate processing apparatus 1 such that a sound such as a predetermined melody is produced during opening/closing of the chamber lid 200, the user can be alerted that opening/closing of the chamber lid 200 is being carried out, and hence risks that might arise upon malfunction of the crane unit 500 can be avoided.

In the above embodiment, the crane unit 500 constructed from the air cylinder 510 and the linear guide 520 is used as the lid supporting mechanism that suspends and supports the chamber lid 200. However, so long as the chamber lid 200 can be moved in the vertical direction and a predetermined horizontal direction, any lid supporting mechanism may be used, for example a ball screw or the like may be used instead of the air cylinder 510. Note also that the above members are preferably constructed such that particles are not produced therefrom for use in a clean room.

By using the crane unit 500 in which are combined the air cylinder 510 and the linear guide 520, the controllability can be increased, the amount of noise produced when opening/closing the chamber lid 200 can be reduced, and the supporting member that supports the chamber lid 200 can be prevented from becoming large in size. Furthermore, the crane unit 500 can be removed and used with another P/C 100, and hence the cost can be reduced, and the size of storage space therefor required can be reduced.

A maintenance operation for a lid assembly comprised of the chamber lid 200 and the crane unit 500 shown in FIG. 5 will now be described. Examples of the maintenance include cleaning, and dismantling/remodeling/repair. In cleaning, surfaces of inner chamber-component parts inside the P/C 100 are cleaned by the user. In dismantling/remodeling/repair, inner chamber-component parts are removed from the P/C 100.

First, the procedure when cleaning the interior of the P/C 100 shown in FIG. 3 will be described with reference to FIGS. 6A to 6C. Note that in FIGS. 6A to 6C, there are also shown a table 410 on which the P/C 100 is mounted, a maintenance table 420 as described earlier which is disposed in front of the P/C 100 and has a height of, for example, 300 mm, and a casing 450 mounted on an upper surface of the frame 400. A temperature adjusting instrument, a control board, and so on are provided inside the casing 450.

Figure 6A:
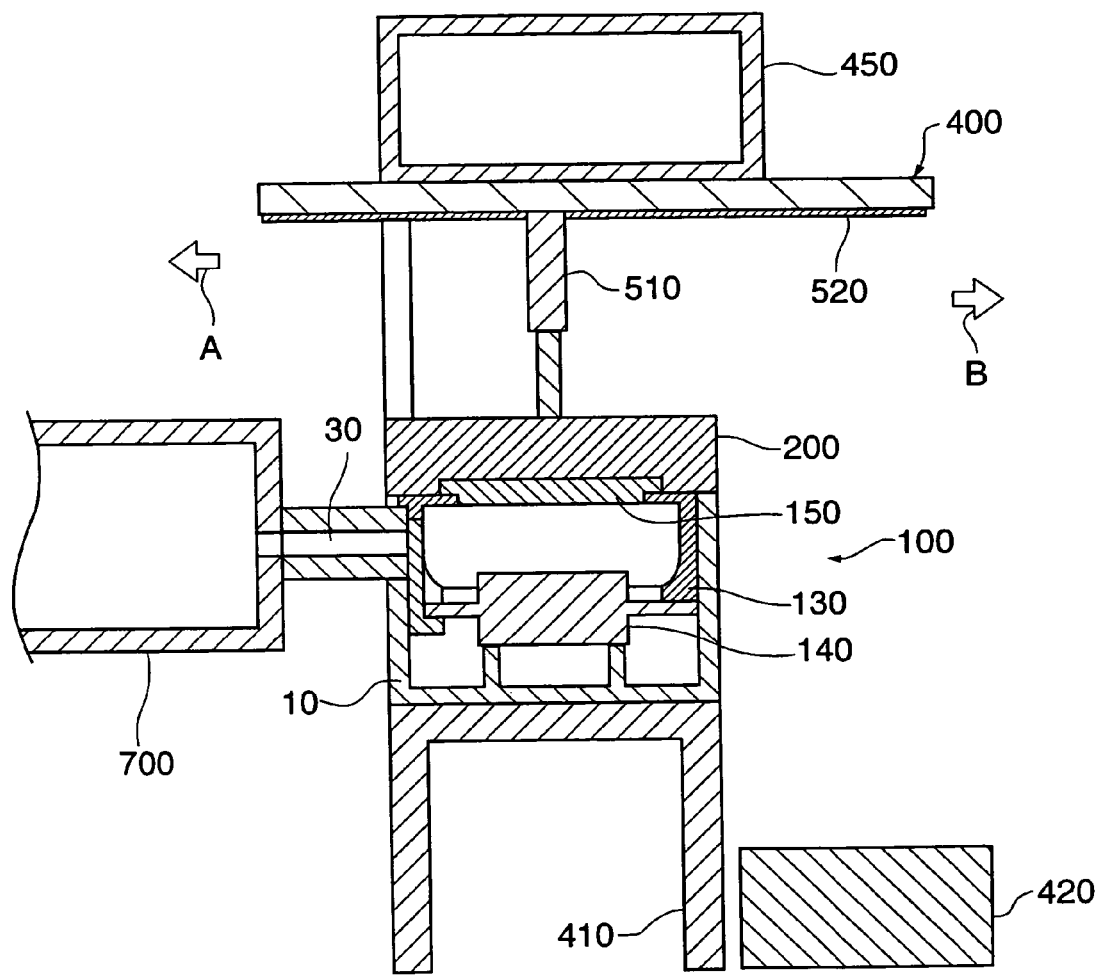
FIG. 6A is a side sectional view showing a state in which the crane unit appearing in FIG. 5 has been installed for carrying out maintenance on the processing chamber shown in FIG. 3.

FIG. 6A shows a state in which the crane unit 500 appearing in FIG. 5 has been installed, and is a side sectional view corresponding to FIG. 5.

Figure 6B:
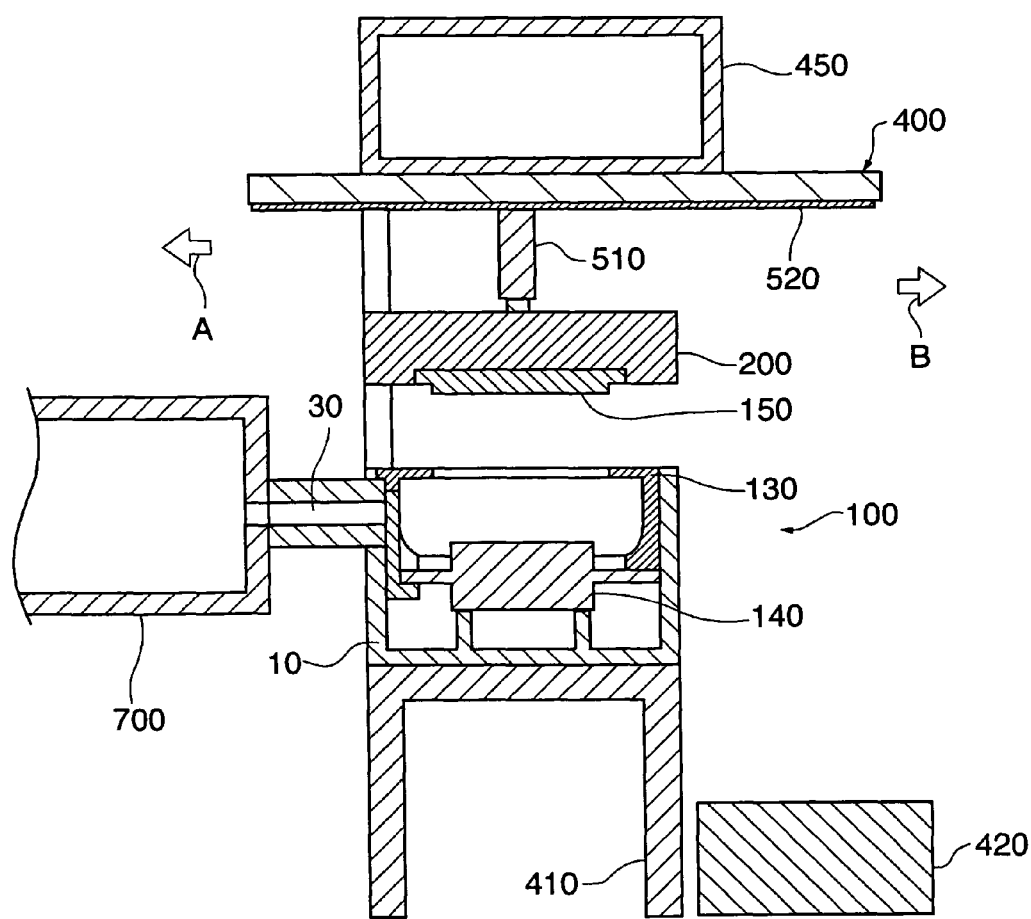
FIG. 6B is a side sectional view showing a state in which a chamber lid and an upper electrode assembly have been moved vertically upward using the crane unit.

FIG. 6B shows a state in which the chamber lid 200 and the upper electrode assembly 150 of the P/C 100 have been moved vertically upward using the crane unit 500. As shown in FIG. 6B, surfaces of the upper electrode assembly 150, the deposit shield 130, and the stage unit 140 are exposed, and hence the user can carry out cleaning efficiently from the front and both sides.

Figure 6C:
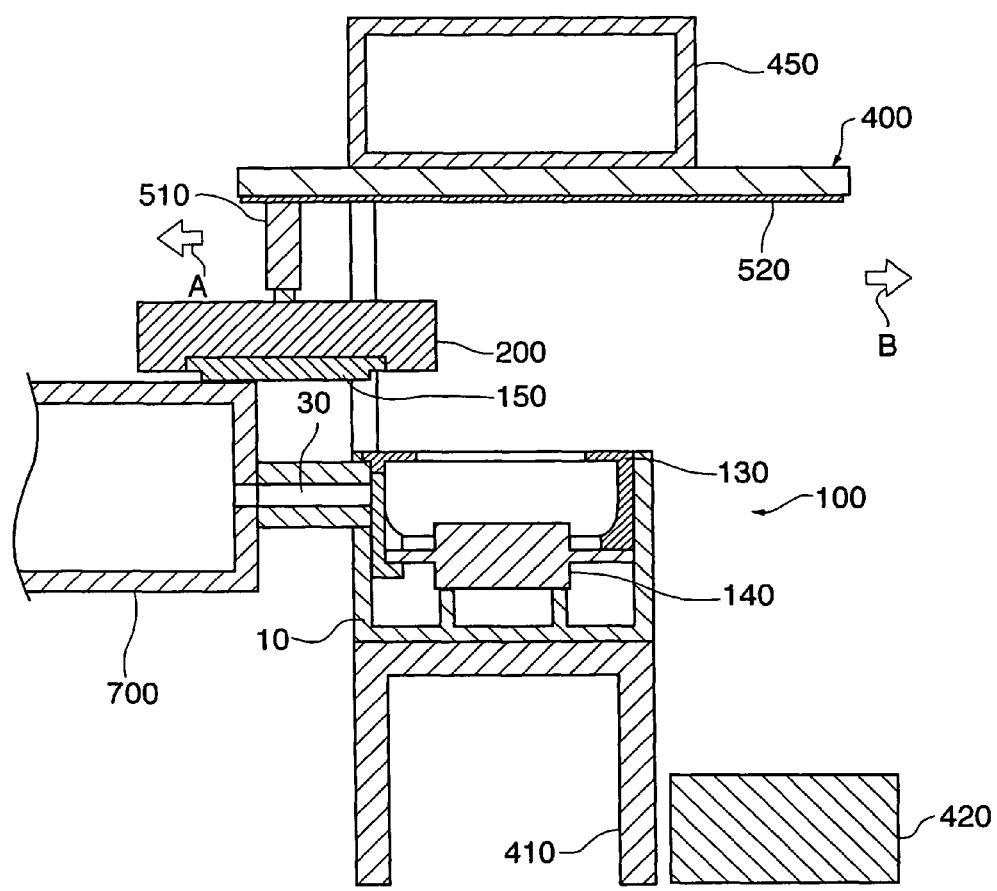
FIG. 6C is a side sectional view showing a state in which the chamber lid and the upper electrode assembly have been moved horizontally in a direction of the arrow A (backward)

FIG. 6C shows a state in which the chamber lid 200 and the upper electrode assembly 150 have been moved horizontally in the direction of the arrow A (backward). In the state shown in FIG. 6C, a large maintenance space has been secured above the P/C 100, and hence the user can clean the surfaces of the deposit shield 130 and the stage unit 140 even more efficiently than in the state shown in FIG. 6B.

Moreover, as shown in FIG. 6C, the chamber lid 200 is disposed such as to protrude into a place that was an open unoccupied space above the T/C 700, and hence an increase in dead space occupied by moving the chamber lid 200 can be prevented. In particular, with the substrate processing apparatus 1 having six of the P/C's 100 as shown in FIG. 1, by using the open unoccupied spaces above the T/C 700, maintenance can be carried out on each of the P/C's 100 simultaneously without interference between the chamber lids 200 of the P/C's 100.

Figure 7:
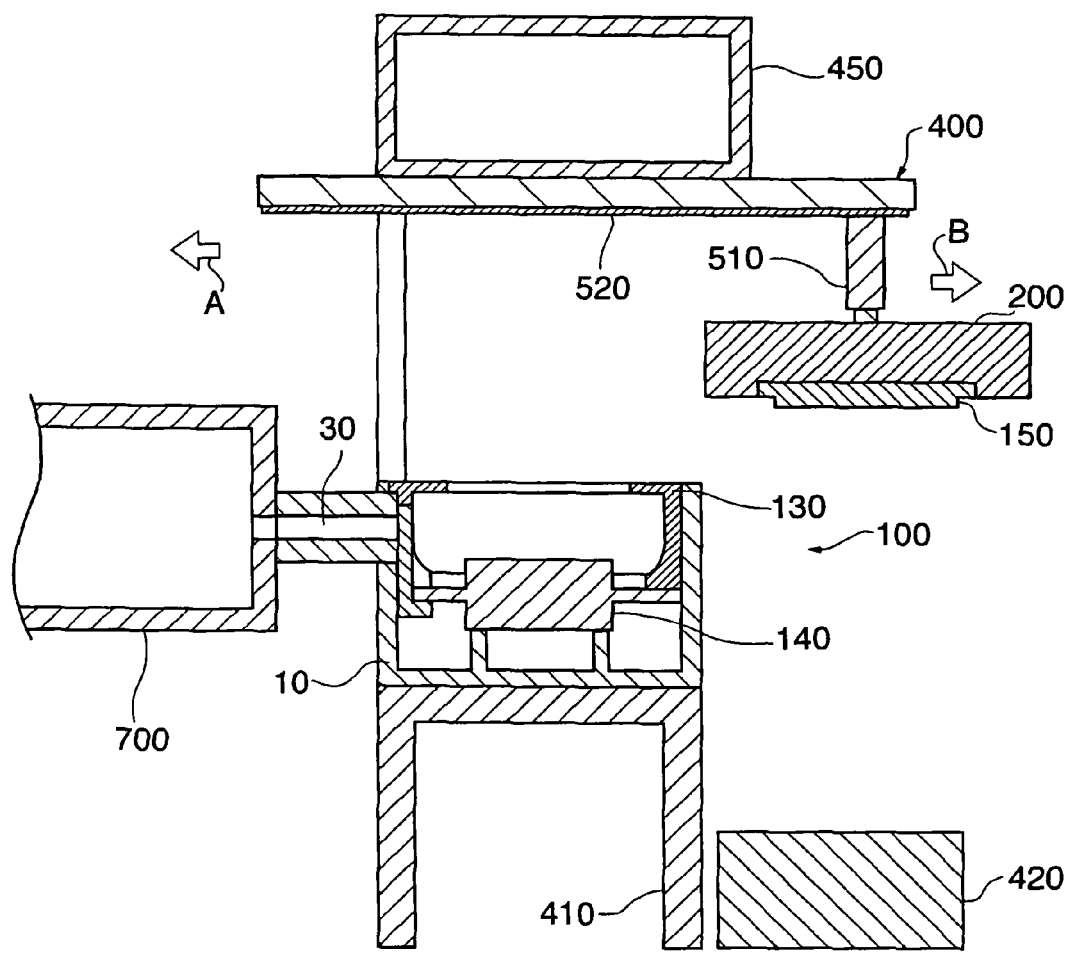
FIG. 7 is a side sectional view showing a state in which the chamber lid and the upper electrode assembly have been moved horizontally in a direction of the arrow B (forward) from the state as shown in FIG. 6B for carrying out maintenance on the processing chamber shown in FIG. 3.

Moreover, as shown in FIG. 7, if the chamber lid 200 and the upper electrode assembly 150 are moved horizontally in the direction of the arrow B (forward) from the state shown in FIG. 6B, then the surface of the upper electrode assembly 150 can be exposed in a position closer to the user. As a result, dismantling, remodeling, repair, replacement, inspection or the like can be carried out easily by the user on the upper electrode assembly 150, and moreover cleaning can be carried out efficiently.

In the description with reference to FIGS. 6A and 7, both the chamber lid 200 and the upper electrode assembly 150 are moved. However, by removing in advance the screws 152 (see FIGS. 3 and 5) that join the two together, it is possible to move only the chamber lid 200.

Figure 8:
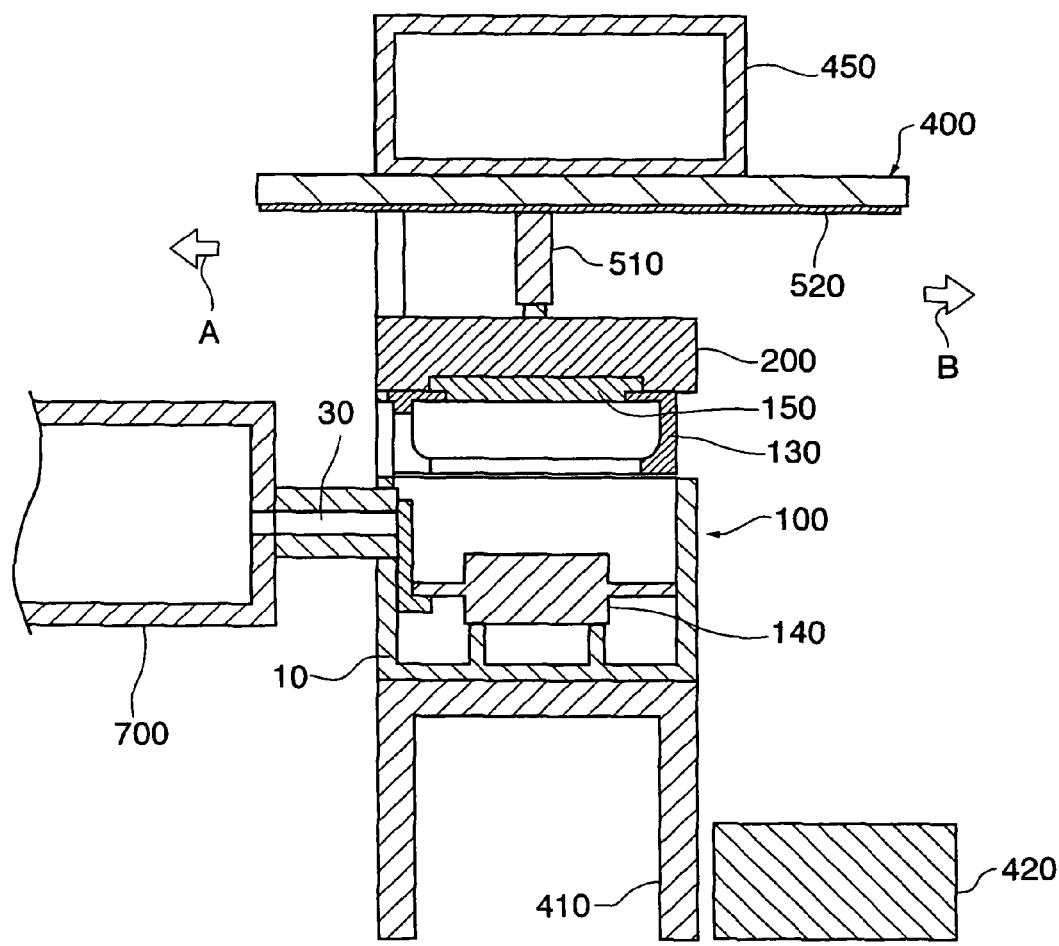
FIG. 8 is a side sectional view schematically showing a state of the processing chamber when the chamber lid, the upper electrode assembly, and the deposit shield appearing in FIG. 3 have been moved vertically upward.

Moreover, as shown in FIG. 8, by fitting predetermined screws into the screw holes 210a and 210b (see FIGS. 3 and 5) so as to join the chamber lid 200 and the deposit shield 130 together, it is possible to move the chamber lid 200, the deposit shield 130, and the upper electrode assembly 150 together. As a result, the deposit shield 130 can be removed accurately in the vertical direction. With prior art, on the other hand, because the dimension of the deposit shield in the height direction is large, there has been a problem that the deposit shield 130 cannot be removed accurately in the vertical direction, interference occurring between a lower portion of the deposit shield and the side wall 10 of the P/C 100. According to the present art shown in FIG. 8, this problem can be resolved, and hence the work efficiency of the user during maintenance can be markedly improved.

In the above embodiment, in the case that the stage unit 140 is light in weight, by joining the stage unit 140 to the chamber lid 200 via a predetermined joining member, as with the deposit shield 130 in FIG. 8, the stage unit 140 can be removed from the P/C 100. However, the stage unit 140 is generally very heavy, having a mass of 100 kg for example, and hence such removal is difficult.

Figure 9:
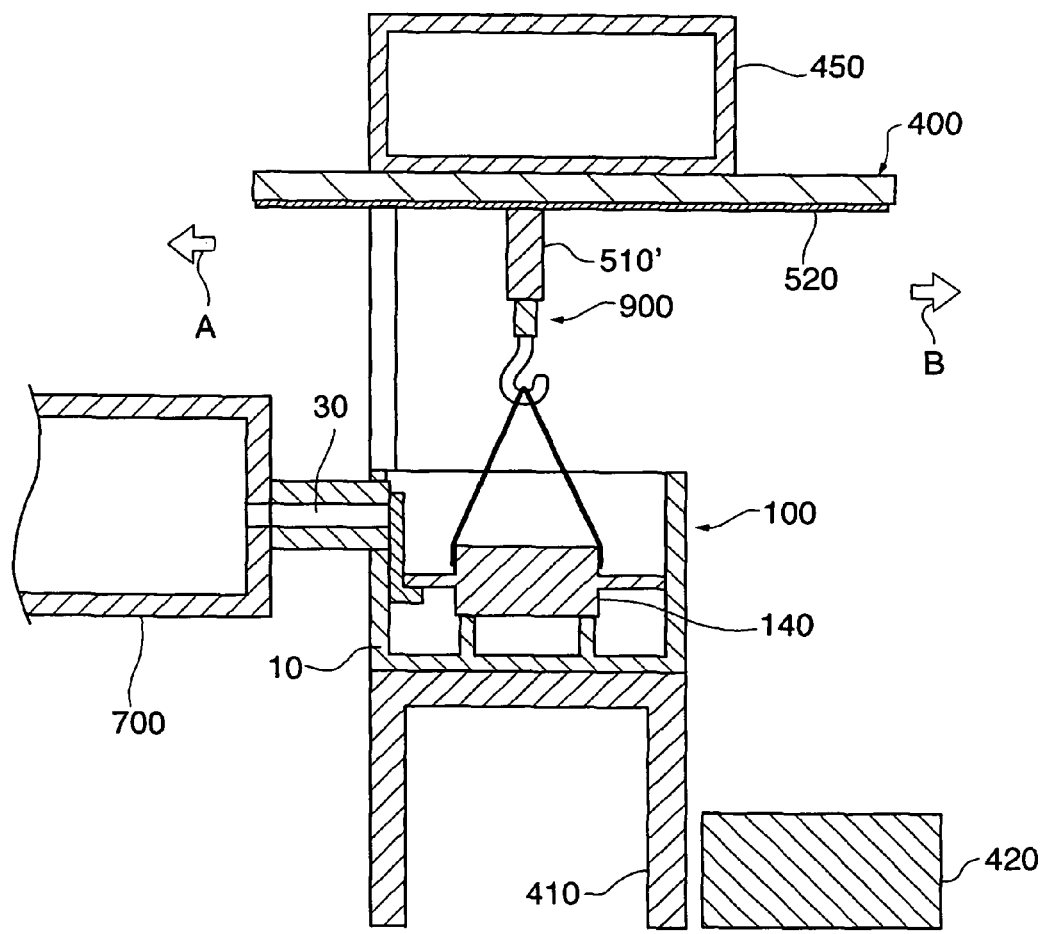
FIG. 9 is a side sectional view schematically showing a state in which a stage unit including a stage inside the processing chamber has been moved vertically upward, according to a variation of the present embodiment.

FIG. 9 is a side sectional view showing schematically a state in which the stage unit 140 inside the P/C 100 has been moved vertically upward, according to a variation of the present embodiment.

In the present variation, instead of the crane unit 500 shown in FIG. 5, a transfer jig 900 as shown in FIG. 9 is used, whereby a very heavy stage unit 140 can be transferred out.

The transfer jig 900 has an air cylinder-attached removing jig 510' in place of the air cylinder 510 of the crane unit 500, the linear guide 520 of the crane unit 500 being used as it is. As a result, positioning of the removing jig 510' can be carried out easily. Note that the removing jig 510' is preferably obtained by replacing only the end 510a of the air cylinder 510, whereby the rest of the air cylinder 510 can be used as it is, and moreover attachment of the removing jig 510' can be carried out easily.

First, as shown in FIG. 9, the chamber lid 200, the upper electrode assembly 150, and the deposit shield 130 are removed, and the removing jig 510' is attached in place of the air cylinder 510. Next, the removing jig 510' and the stage unit 140 are joined together by a high-strength member such as a wire. After that, the stage unit 140 is removed from the P/C 100 similarly to in FIG. 6B.

According to the transfer jig 900 of the present variation, a very heavy stage unit 140 can be easily transferred out without using a large maintenance jig such as a jib crane or a gantry crane. As a result, the work efficiency of the user during maintenance can be markedly improved. Moreover, the present variation is also useful when the stage unit 140 is hot.

Note that in the embodiment and the variation thereof described above, the substrates to be processed are semiconductor wafers, but the substrates to be processed may instead be LCD or FPD (flat panel display) glass substrates or the like.

While the present invention has been described with reference to exemplary embodiment, it is to be understood that the invention is not limited to the disclosed the embodiment and variation thereof. The scope of the following claims is to be accorded the broadest interpretation so as to encompass all such modifications and equivalent structures and functions.

This application claims the benefit of Japanese Patent Application No. 2005-360934, filed Dec. 14, 2005, and U.S. Provisional Application Ser. No. 60/775,788, filed Feb. 23, 2006, which are hereby incorporated by reference herein in their entirety.

What is claimed is:

1. A substrate processing apparatus comprising:
at least one processing chamber in which predetermined processing is carried out on a substrate to be processed, said processing chamber having provided in an upper portion thereof a processing chamber upper lid for closing up said processing chamber; and
a lid supporting mechanism that suspends and supports said processing chamber upper lid, wherein
said lid supporting mechanism comprises a vertical movement regulating portion that holds said processing chamber upper lid movably in a vertical direction thereabove, and a horizontal movement regulating portion that holds said processing chamber upper lid movably in a predetermined horizontal direction,
said horizontal movement regulating portion holds said vertical movement regulating portion and moves said processing chamber upper lid suspended and supported by said vertical movement regulating portion together with said vertical movement regulating portion in the predetermined horizontal direction,
said vertical movement regulating portion comprises an air cylinder that is extensible in the vertical direction and a positioning device that is moved with said air cylinder, said positioning device being provided with at least one positioning pin, and
said horizontal movement regulating portion comprises a linear guide that is provided with a rail extending in the horizontal direction, a plurality of pinholes being formed on said rail so as to engage said positioning pin.

2. A substrate processing apparatus as claimed in claim 1, further comprising a controller that controls a position to which said processing chamber upper lid is moved, wherein
said controller is provided with at least one button that controls the position of said air cylinder in the vertical direction, and
said button is constructed such as to be operable when said positioning pin of said positioning device is engaged into at least one of said pinholes, and to be inoperable when said positioning pin is not engaged into at least one of said pinholes.

3. A substrate processing apparatus as claimed in claim 1, wherein said processing chamber upper lid has formed therein at least one hole into which is fitted a joining member that joins said processing chamber upper lid to at least one inner processing chamber-component part disposed inside said processing chamber.

4. A substrate processing apparatus as claimed in claim 3, wherein said at least one inner processing chamber-component part comprises at least one of an upper electrode that supplies electrical power required for the predetermined processing into said processing chamber, and an inner wall protecting member that at least partially protects an inner surface of said processing chamber.

5. A substrate processing apparatus as claimed in claim 1, further comprising a stage unit including a stage for mounting the substrate to be processed provided inside said processing chamber, and wherein said air cylinder is constructed such that at least an end portion thereof on a side of said processing chamber upper lid can be replaced with a removing jig for removing said stage unit from said processing chamber.

6. A substrate processing apparatus as claimed in claim 1, wherein said air cylinder is joined to an upper surface of the processing chamber upper lid at a position displaced by a predetermined amount from a center of the upper surface of the processing chamber upper lid.

7. A substrate processing apparatus as claimed in claim 1, wherein said air cylinder presents between said linear guide and said processing chamber upper lid.

8. A substrate processing apparatus as claimed in claim 1, wherein said air cylinder is constructed such as to operate at low speed immediately before closing of said processing chamber upper lid.

9. A substrate processing apparatus as claimed in claim 1, wherein the at least one positioning pin and the plurality of pinholes form a locking mechanism that controls operation of the lid supporting mechanism.

10. A lid supporting apparatus that suspends and supports a processing chamber upper lid provided in an upper portion of at least one processing chamber of a substrate processing apparatus in which predetermined processing is carried out on a substrate to be processed, the processing chamber upper lid being for closing up the processing chamber, the lid supporting apparatus comprising:
   a vertical movement regulating portion that holds the processing chamber upper lid movably in a vertical direction thereabove; and
   a horizontal movement regulating portion that holds the processing chamber upper lid movably in a predetermined horizontal direction,
   wherein said horizontal movement regulating portion holds said vertical movement regulating portion and moves the processing chamber upper lid suspended and supported by said vertical movement regulating portion together with said vertical movement regulating portion in the predetermined horizontal direction,
   said vertical movement regulating portion comprises an air cylinder that is extensible in the vertical direction and a positioning device that is moved with said air cylinder, said positioning device being provided with at least one positioning pin, and
   said horizontal movement regulating portion comprises a linear guide that is provided with a rail extending in the horizontal direction, a plurality of pinholes being formed on said rail so as to engage said positioning pin.

11. A lid supporting apparatus as claimed in claim 10, wherein said air cylinder presents between said linear guide and said processing chamber upper lid.

12. A lid supporting apparatus as claimed in claim 10, further comprising a controller that controls a position to which said processing chamber upper lid is moved, wherein
   said controller is provided with at least one button that controls the position of said air cylinder in the vertical direction, and
   said button is constructed such as to be operable when said positioning pin of said positioning device is engaged into at least one of said pinholes, and to be inoperable when said positioning pin is not engaged into at least one of said pinholes.

13. A lid supporting apparatus as claimed in claim 10, wherein said air cylinder is constructed such as to operate at low speed immediately before closing of said processing chamber upper lid.

14. A lid supporting apparatus as claimed in claim 10, wherein the at least one positioning pin and the plurality of pinholes form a locking mechanism that controls operation of the lid supporting mechanism.

* * * * *